United States Patent
Cheng

(10) Patent No.: US 12,400,948 B2
(45) Date of Patent: Aug. 26, 2025

(54) STRUCTURE AND METHOD FOR INTERLEVEL DIELECTRIC LAYER WITH REGIONS OF DIFFERING DIELECTRIC CONSTANT

(71) Applicant: Taiwan Semiconductor Manufacturing Co., Ltd., Hsinchu (TW)

(72) Inventor: Anhao Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/604,310

(22) Filed: Mar. 13, 2024

(65) Prior Publication Data

US 2024/0250018 A1    Jul. 25, 2024

Related U.S. Application Data

(62) Division of application No. 17/461,231, filed on Aug. 30, 2021, now Pat. No. 11,955,421.

(51) Int. Cl.
| | |
|---|---|
| *H01L 23/522* | (2006.01) |
| *H01L 21/768* | (2006.01) |
| *H01L 23/532* | (2006.01) |
| *H10D 84/01* | (2025.01) |
| *H10D 84/03* | (2025.01) |

(52) U.S. Cl.
CPC .... *H01L 23/5223* (2013.01); *H01L 21/76828* (2013.01); *H01L 23/53295* (2013.01); *H10D 84/0149* (2025.01); *H10D 84/038* (2025.01); *H01L 21/76802* (2013.01); *H01L 21/76832* (2013.01); *H01L 21/76877* (2013.01); *H01L 23/53228* (2013.01)

(58) Field of Classification Search
CPC ................ H10D 84/0149; H10D 1/714; H01L 23/5223; H01L 21/76828
USPC ....................................................... 257/532
See application file for complete search history.

(56) References Cited

U.S. PATENT DOCUMENTS

| | | | |
|---|---|---|---|
| 2006/0183062 A1 | 8/2006 | Dimitrakopoulos et al. | |
| 2008/0173914 A1* | 7/2008 | Hashimoto | H10D 84/811 257/E27.11 |
| 2008/0311528 A1* | 12/2008 | Bissey | H01L 21/312 257/E21.507 |

\* cited by examiner

*Primary Examiner* — Quoc D Hoang
(74) *Attorney, Agent, or Firm* — Seed IP Law Group

(57) ABSTRACT

An integrated circuit includes a plurality of transistors and an interlevel dielectric layer formed over the transistors. The interlevel dielectric layer includes a first region and a second region with a higher dielectric constant than the first region. The difference in dielectric constant is produced by curing the first region shielding the second region from the curing. Metal signal lines are formed in the first region. Metal-on-metal capacitors are formed in the second region.

20 Claims, 16 Drawing Sheets

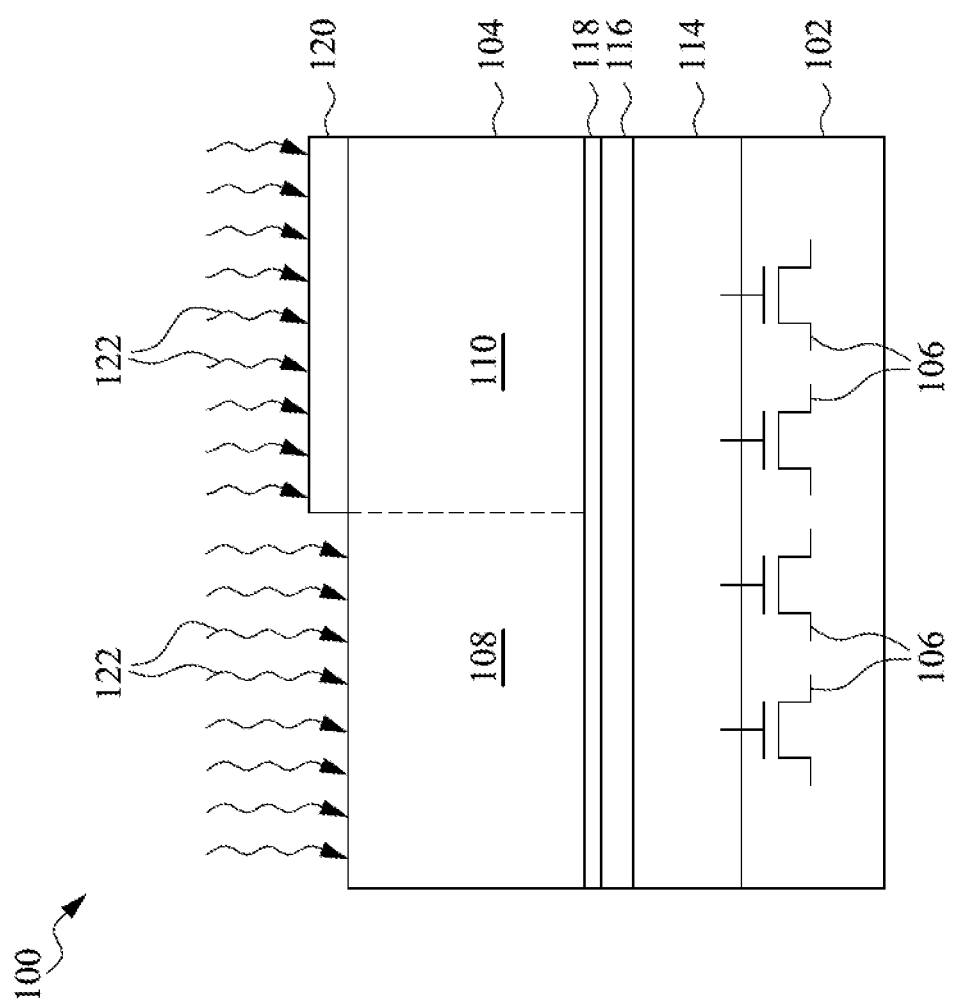

STRUCTURE AND METHOD FOR INTERLEVEL DIELECTRIC LAYER WITH REGIONS OF DIFFERING DIELECTRIC CONSTANT

BACKGROUND

Technical Field

The present disclosure relates to the field of integrated circuits. The present disclosure relates more particularly to integrated circuits including metal signal lines and capacitors.

Description of the Related Art

There has been a continuous demand for increasing computing power in electronic devices including smart phones, tablets, desktop computers, laptop computers and many other kinds of electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. These techniques can form very small features. However, there are many difficulties involved in ensuring high performance of the devices and features.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F and 2H are cross-sectional views of an integrated circuit at intermediate stages of processing, according to some embodiments.

DETAILED DESCRIPTION

Figure 1:
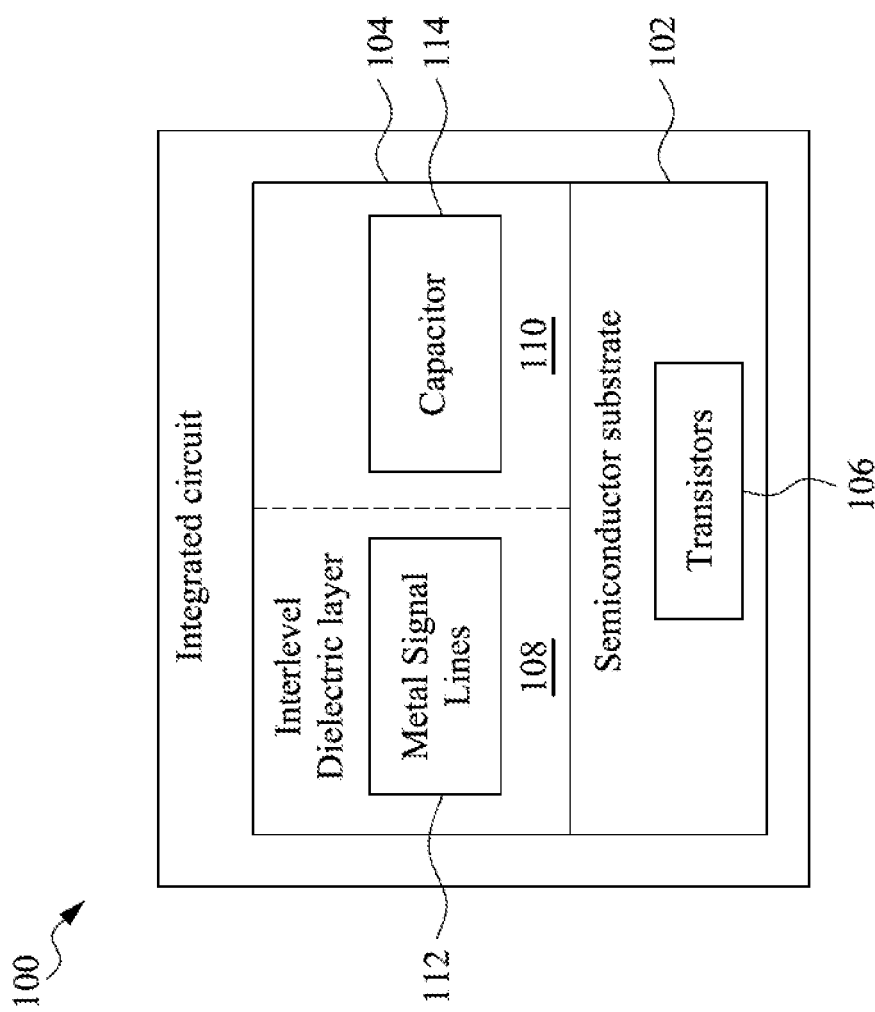
FIG. 1 is a block diagram of an integrated circuit, according to some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit including transistors, metal signal lines, and a capacitor. The transistors are formed in conjunction with a semiconductor substrate. The metal signal lines and the capacitor are implemented in an interlevel dielectric layer above the semiconductor substrate. Embodiments of the present disclosure advantageously form distinct regions of differing dielectric constant in the interlevel dielectric layer. The interlevel dielectric layer advantageously includes a first region having a first dielectric constant and a second region having a second dielectric constant higher than the first dielectric constant. The metal signal lines are formed in the first region. The capacitor is formed in the second region. The metal signal lines benefit from the relatively low dielectric constant of the first region. The capacitor benefits from the relatively high dielectric constant of the second region. Accordingly, embodiments of the present disclosure provide an integrated circuit that has improved performance over traditional integrated circuits by adjusting the dielectric constant in various regions of a single interlevel dielectric layer. In particular, the metal signal lines have a low parasitic capacitance, while the capacitor has a high capacitance.

FIG. 1 is a block diagram of an integrated circuit 100, according to some embodiments. The integrated circuit 100 includes a semiconductor substrate 102 and an interlevel dielectric layer 104 above the semiconductor substrate 102. The integrated circuit 100 includes a plurality of transistors 106 formed in conjunction with the semiconductor substrate 102. Metal signal lines 112 and a capacitor 114 are formed in the interlevel dielectric layer 104. As will be set forth in more detail below, the metal signal lines 112 and the capacitor 114 each have a high-performance based on the interlevel dielectric layer 104 having multiple regions of differing dielectric constants.

The semiconductor substrate 102 can include a monocrystalline semiconductor material. The monocrystalline semiconductor material can include silicon, silicon germanium, gallium arsenide, or other semiconductor materials. The semiconductor substrate 102 can include multiple layers of different monocrystalline semiconductor materials. For example, the semiconductor substrate 102 may include one or more layers of monocrystalline silicon and one or more layers of monocrystalline silicon germanium. The semiconductor substrate 102 can include various types of semiconductor materials and structures in accordance with the type of the transistors 106.

The transistors 106 can include traditional MOSFET transistors each having a gate dielectric positioned on the semiconductor substrate 102 and a gate electrode positioned on the gate dielectric. Each transistor 106 can include a source, a drain, and a channel region positioned in the semiconductor substrate 102. The transistors 106 can include FinFET transistors, gate all around nanosheet transistors, bipolar transistors, or other types of transistors without departing from the scope of the present disclosure. While the block diagram of FIG. 1 shows the transistors 106 positioned within the semiconductor substrate 102, in practice the transistors 106 are formed in conjunction with the semiconductor substrate 102, but not entirely within the semiconductor substrate 102. Instead, portions of the transistors 106 may be formed within the semiconductor substrate 102 and other portions may be formed above the semiconductor substrate 102.

The interlevel dielectric layer 104 is formed above the semiconductor substrate 102. Metal signal lines 112 are formed in the interlevel dielectric layer 104. The metal signal lines 112 carry signals to and from the terminals of the transistors 106. Though not shown in FIG. 1, the metal signal lines 112 are connected to the source, drain, and gate terminals of the transistors 106 by conductive vias and metal contacts. Furthermore, in practice, the integrated circuit 100 may include multiple stacked interlevel dielectric layers each including metal signal lines interconnected by conductive vias or other conductive structures.

The interlevel dielectric layer 104 also includes a capacitor 114. The capacitor 114 includes two conductive electrodes separated from each other by portions of the interlevel dielectric layer 104. In practice, the electrodes of the capacitor 114 may include portions formed in the interlevel dielectric layer 104 and portions formed in other interlevel dielectric layers formed above the interlevel dielectric layer 104. The various portions of the electrodes in the different interlevel dielectric layers may be connected by conductive vias or other conductive structures. In some embodiments, the capacitor 114 is a metal-oxide-metal (MOM) capacitor.

The electrical characteristics of the metal signal lines 112 and the capacitor 104 are based, in part, on the dielectric constant of the interlevel dielectric layer 104. This can be understood with a basic description of the electrical characteristics of a capacitor. Traditionally, a capacitor includes a first plate and a second plate separated from each other by a dielectric material. The capacitance C of the traditional capacitor can be calculated with the following relationship:

$$C = k * \varepsilon_0 * A/d,$$

Where A is the area of the electrodes facing each other, d is the distance separating the electrodes, $\varepsilon_0$ is the permittivity of free space, and k is the dielectric constant of the dielectric material positioned between the two electrodes. From this relationship it can be seen that capacitance is proportional to the dielectric constant k. Accordingly, the capacitance of the capacitor can be increased by increasing the dielectric constant.

Returning to FIG. 1, a high dielectric constant in the interlevel dielectric layer 104 results in a higher capacitance of the capacitor 114. However, the performance of the metal signal lines 112 is improved if the dielectric constant of the interlevel dielectric layer 104 is low. This is because two adjacent metal signal lines 112 will have a parasitic capacitance between each other because they are near each other and are separated from each other by the dielectric material of the interlevel dielectric layer 104. The speed of the integrated circuit 100 is based in part on how quickly signals can be passed through the metal signal lines 112. If there is a high parasitic capacitance between adjacent metal signal lines 112, then it can take a comparatively large amount of time to change the voltages on the metal signal lines 112. This is because the voltage between two electrodes of a capacitor cannot change instantly. The larger the capacitance between the two electrodes, the longer it takes (or a higher current is required) to change the voltage between two capacitors. In the case of adjacent metal signal lines 112, the dielectric constant of the interlevel dielectric layer 104 directly affects the parasitic capacitance, and, thus, the speed with which signals can be passed through the metal signal lines 112. Accordingly, the performance of the metal signal lines 112 increases with a decreased dielectric constant of the interlevel dielectric layer 104.

Advantageously, the interlevel dielectric layer 104 includes a first region 108 and a second region 110. The metal signal lines 112 are formed within the first region 108. The capacitor 114 is formed within the second region 110. The first region 108 has a first dielectric constant. The second region 110 has a second dielectric constant. The first dielectric constant is lower than the second dielectric constant. Because the capacitor 114 is formed in the region 110 having a higher dielectric constant, the capacitance of the capacitor 114 is relatively high. Because the metal signal lines 112 are formed in the region 108 having a lower dielectric constant, the parasitic capacitance between the metal signal lines 112 is relatively low. Both the capacitor 114 and the metal signal lines 112 benefit from the difference in dielectric constant between the first region 108 and the second region 110.

In some embodiments, the interlevel dielectric layer 104 includes an extra low-k dielectric material. The interlevel dielectric layer 104 can include a porous material. The first region 108 may be more porous than the second region 110, leading to a lower dielectric constant in the first region 108 than in the second region 110. In one example, the interlevel dielectric layer 104 includes a porous SiOCH material. Other materials can be utilized for the interlevel dielectric layer 104 without departing from the scope of the present disclosure.

The first and second regions 108 and 110 are formed after deposition of the interlevel dielectric layer 104. In particular, after the interlevel dielectric layer 104 is deposited, a mask is deposited on the interlevel dielectric layer 104. The mask is patterned so that the first region 108 is exposed by the mask while the second region 110 is covered by the mask. The interlevel dielectric layer 104 is irradiated with ultraviolet light in the presence of the mask. The ultraviolet light enters into the first region 108. The ultraviolet light is prevented from entering into the second region 110 by the mask. The ultraviolet light causes a physical effect within the first region 108 that results in the first region 108 having a lower dielectric constant than the second region 110. In one example, the ultraviolet light increases the porosity within the first region 108, thereby decreasing the dielectric constant of the first region 108. The dielectric constant of the second region 110 remains unchanged from the initial deposition of the interlevel dielectric layer 104. Other processes can be utilized to effect differing dielectric constants in the first and second regions 108 and 110 without departing from the scope of the present disclosure.

After the difference in dielectric constant between the first region 108 and the second region 110 has been effected, the metal signal lines 112 and the capacitor 114 can be formed in the interlevel dielectric layer 104. The metal signal lines 112 and the capacitor 114 can be formed by etching trenches in the interlevel dielectric layer 104 and depositing a metal or multiple layers of metal within the trenches. Further details regarding formation of the interlevel dielectric layer 104, the metal signal lines 112, and the capacitor 114 according to some embodiments are described in relation to FIGS. 2A-2H.

While various examples herein describe forming signal lines in the first region 108 and capacitor electrodes in the second region 110, other structures can be formed in the first region 108 and the second region 110 without departing from the scope of the present disclosure.

Figure 2A:
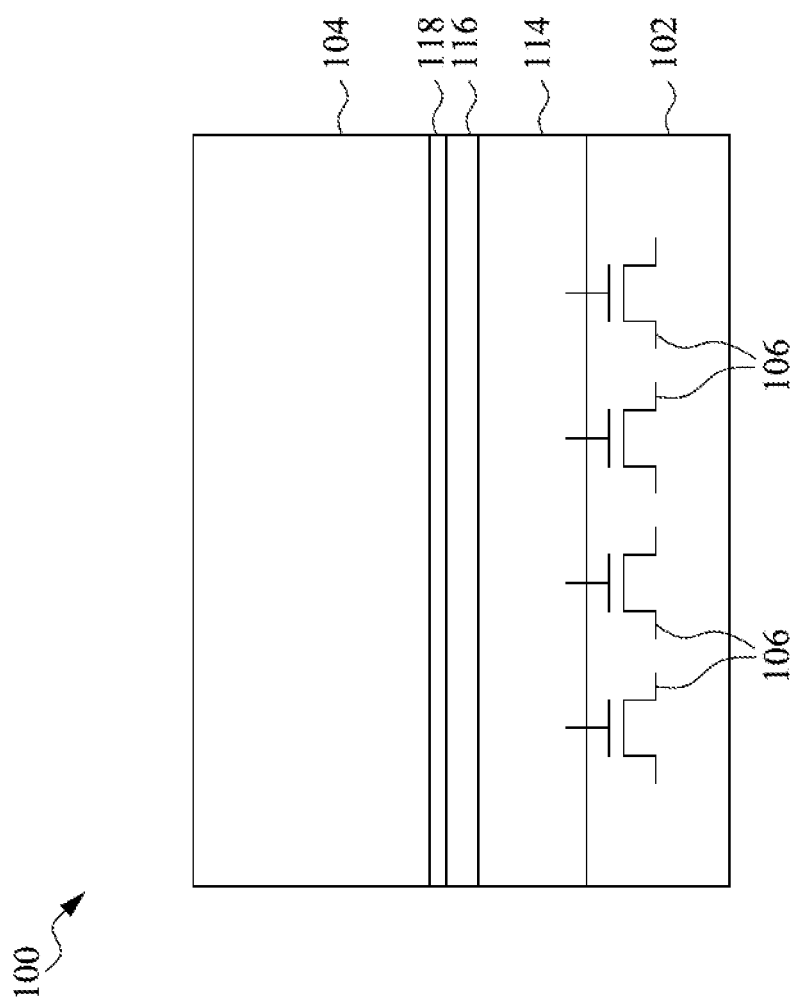

FIG. 2A is a cross-sectional view of an integrated circuit 100 at an intermediate stage of processing, according to some embodiments. The integrated circuit 100 includes a semiconductor substrate 102. The semiconductor substrate 102 can include a monocrystalline semiconductor material. The monocrystalline semiconductor material can include silicon, silicon germanium, gallium arsenide, or other semiconductor materials. The substrate 102 can include multiple layers of different monocrystalline semiconductor materials. For example, the semiconductor substrate 102 may include one or more layers of monocrystalline silicon and one or more layers of monocrystalline silicon germanium. The semiconductor substrate 102 can include various types of semiconductor materials and structures in accordance with the type of the transistors 106.

The integrated circuit 100 includes a dielectric layer 114 on the semiconductor substrate 102. The dielectric layer 114 can include silicon oxide, silicon nitride, or other dielectric materials. In practice, the dielectric layer 114 may include multiple dielectric layers. For example, the dielectric layer 114 may include one or more layers of silicon nitride and one or more layers of silicon oxide formed on the semiconductor substrate 102.

Transistors 106 are formed in conjunction with the semiconductor substrate 102 and the dielectric layer 114. The transistors 106 can include source, drain, and channel regions within the semiconductor substrate 102. The transistors 106 can include a gate electrode on the semiconductor substrate 102. The dielectric layer 114 may cover the gate electrode. In practice, the dielectric layer 114 may include gate dielectrics and gate spacers. Though not shown in FIG. 2A, electrical connectors may be formed in the dielectric layer 114. The electrical connectors can include conductive vias, plugs, or other structures that electrically contact the source, drain, and gate electrodes of the transistors 106. These electrical connectors pass signals to and from the various electrodes or terminals of the transistors 106.

The integrated circuit 100 includes a dielectric layer 116 on the dielectric layer 114. The dielectric layer 116 can include silicon carbide, silicon nitride, or other dielectric materials. The dielectric layer 116 can be deposited by chemical vapor deposition (CVD), atomic layer deposition (ALD), or physical vapor deposition (PVD). The dielectric layer 116 can have a thickness between 20 nm and 100 nm. Other materials, deposition processes, and thicknesses can be utilized for the dielectric layer 116 without departing from the scope of the present disclosure.

The integrated circuit 100 includes a dielectric layer 118 on the dielectric layer 116. In some embodiments, the dielectric layer 118 includes tetraethoxysilane (TEOS). Alternatively, the dielectric layer 118 can include silicon nitride, silicon carbide, or other dielectric materials. The dielectric layer 118 can be deposited by CVD, ALD, or PVD. The dielectric layer 118 can have a thickness between 10 nm and 50 nm. Other materials, deposition processes, and thicknesses can be utilized for the dielectric layer 118 without departing from the scope of the present disclosure.

The integrated circuit 100 includes an interlevel dielectric layer 104 on the dielectric layer 118. The interlevel dielectric layer 104 is an ELK dielectric layer. In some embodiments, the interlevel dielectric layer 104 includes SiOCH. The interlevel dielectric layer 104 can be deposited by a plasma enhanced chemical vapor deposition process (PECVD). During the PECVD process, two precursors are flowed into the deposition chamber. The first precursor can include an orthosilicate glass precursor. The orthosilicate glass precursor can include diethoxymethylsilane (DEMS) precursor. Alternatively, the first precursor can include methyl dioxyethylsilane (mDEOS). The second precursor is a porogen that co-deposits with the first precursor. In some embodiments, the porogen includes Alpha-terpinene. The porogen results in grains or compounds form within the first interlevel dielectric layer. The porogen can later be removed by curing, as will be described in more detail below. In some embodiments, during or after the flow of the first and second precursors, O2 is flowed into the deposition chamber while a plasma is generated in accordance with PECVD processes. The result of this process is a SiOCH interlevel dielectric layer 104 having embedded porogen grains or compounds. In some embodiments, after deposition the interlevel dielectric layer 104 initially has a dielectric constant between 2.5 and 5. In some embodiments, the interlevel dielectric layer 104 initially has a dielectric constant between 2.7 and 3.0. The interlevel dielectric layer 104 has a thickness between 50 nm and 500 nm. Other materials, processes, and thicknesses can be utilized for the interlevel dielectric layer 104 without departing from the scope of the present disclosure.

In FIG. 2B, a mask 120 has been formed and patterned on the interlevel dielectric layer 104. The mask 120 can include titanium nitride, silicon oxide, silicon nitride, or other materials. The mask 120 can be initially deposited in a blanket deposition on the entire top surface of the interlevel dielectric layer 104. After deposition of the mask 120, the mass can be patterned by standard photolithography processes. After the mask has been patterned, the mask 120 exposes a first region 108 of the interlevel dielectric layer 104 and covers a second region 110 of the interlevel dielectric layer 104. Other materials and processes can be utilized to form and pattern the mask 120 without departing from the scope of the present disclosure.

After the mask has been patterned, a curing process is performed to cure the interlevel dielectric layer 104. The curing process removes the porogen from the exposed first region 108 of the interlevel dielectric layer 104. After removal of the porogen form the interlevel dielectric layer 104, the first region 108 is highly porous. Due to the presence of the mask, the curing process does not remove the porogen from the second region 110. Accordingly, the first region 108 is more porous than the second region 110 after the curing process. The result is that the first region 108 has a lower dielectric constant than the second region 110. In one example, after the curing process the dielectric constant of the first region 108 is lower than the dielectric constant of the second region by a value between 0.3 and 2.0. In some embodiments, the dielectric constant of the first region 108 is between 2.0 and 4.0, while the dielectric constant of the second region is between 2.5 and 5.0. While these ranges overlap, the first region 108 will have a lower dielectric constant than the second region 110 after curing.

In some embodiments, the curing process includes irradiating the integrated circuit 100 with ultraviolet light 122. The ultraviolet light 122 penetrates into the first region 108 of the interlevel dielectric layer 104. The ultraviolet light 122 causes the destruction and ejection of the porogen in the first region 108. The destruction and ejection of the porogen in the first region 108 leaves the aforementioned pores in the first region 108. The ultraviolet light 122 does not penetrate significantly into the second region 110 because the second region 110 is covered by the mask 120. Accordingly, the porogens are not destroyed and ejected from the second region 110 of the interlevel dielectric layer 104.

In some embodiments, the curing process includes bombarding the integrated circuit 100 with an electron beam (e-beam). The e-beam causes the destruction and ejection of the porogens from the first region 108 but not from the second region 110. Other curing processes can be utilized without departing from the scope of the present disclosure.

In some embodiments, the difference in dielectric constants between the first region 108 and the second region 110 is effected by curing the first region 108 and not curing the second region 110. In the examples given above, this is accomplished by a patterned mask 120. However, other processes can be utilized to selectively cure the first region 108 while not curing the second region 110.

Figure 2C:
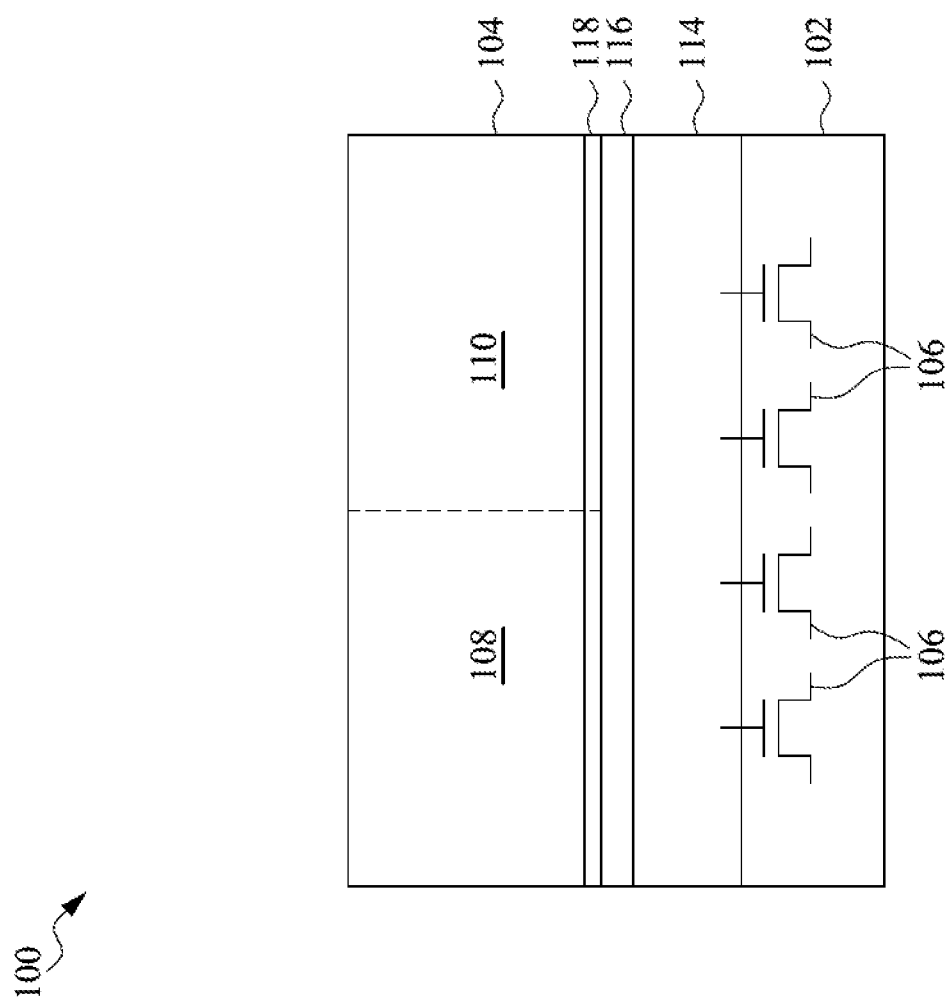

In FIG. 2C, the mask 120 has been removed from the interlevel dielectric layer 104. The first region 108 and the second region 110 are exposed. Formation of signal lines 112 and the capacitor 114 in the interlevel dielectric layer 104 and now be performed.

Figure 2D:
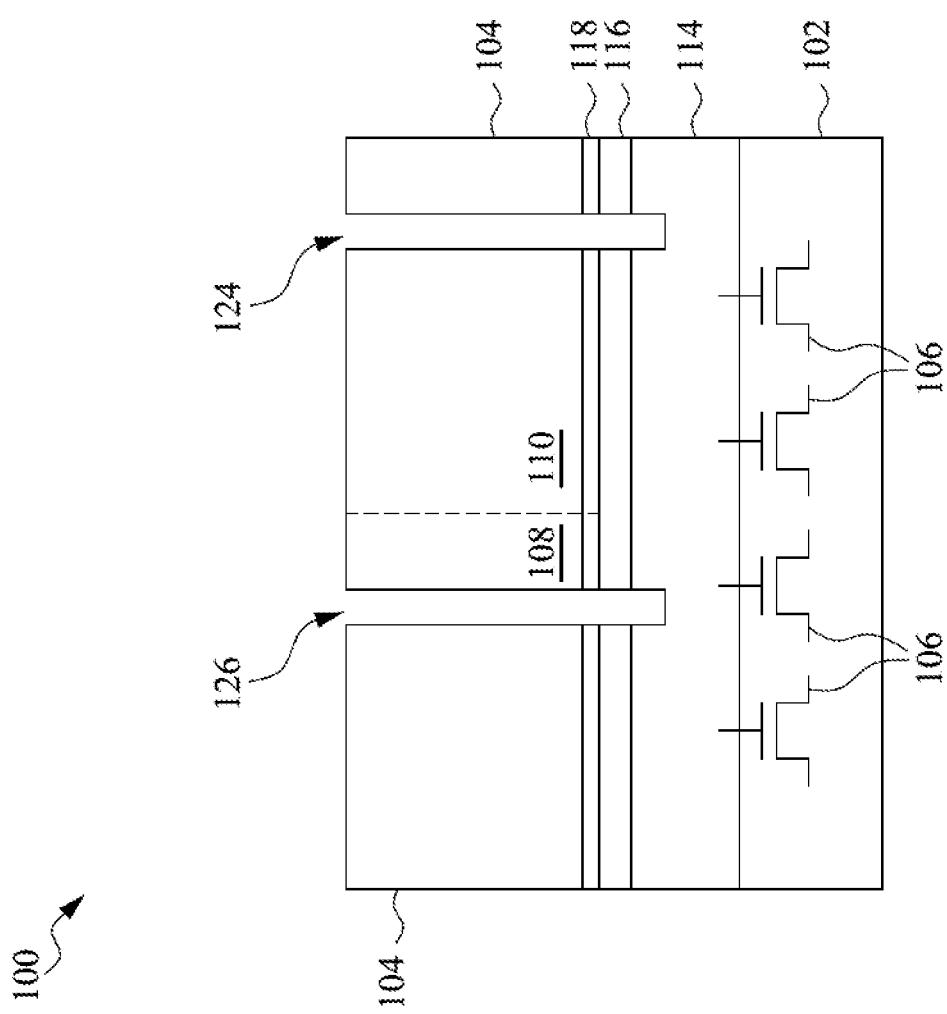

In FIG. 2D, a trench 124 has been opened in the second region 110. The trench 124 also extends through the dielectric layers 116 and 118 into the dielectric layer 114. Though not shown in FIG. 2D, the trench 124 may expose a conductive structure embedded in the dielectric layer 114 to enable electrical connection with a terminal of the transistors 106. As will be set forth in more detail below, the trench 124 is utilized for a conducted via.

In FIG. 2D, a trench 126 has been opened in the first region 108. The trench 126 also extends through the dielectric layers 116 and 118 into the dielectric layer 114. Though not shown in FIG. 2D, the trench 126 may expose a conductive structure embedded in the dielectric layer 114 to enable electrical connection with a terminal of the transistors 106. As will be set forth in more detail below, the trench 126 is utilized for a conducted via.

The trenches 124 and 126 can be formed using standard photolithography and etching techniques. A mask can be formed and patterned to expose the top surface of the interlevel dielectric layer 104 at the intended locations of the trenches 124 and 126. One or more etching processes can then be performed to etch the material of the interlevel dielectric layer 104, and the dielectric layers 118, 116, and 114. The etching processes can include wet etching or dry etching processes. In some embodiments, the etching processes are highly anisotropic. While a single trench 124 and a single trench 126 are shown in FIG. 2D, in practice a large number of trenches 124 and 126 may be formed in the first region 108 and the second region 110.

Figure 2E:
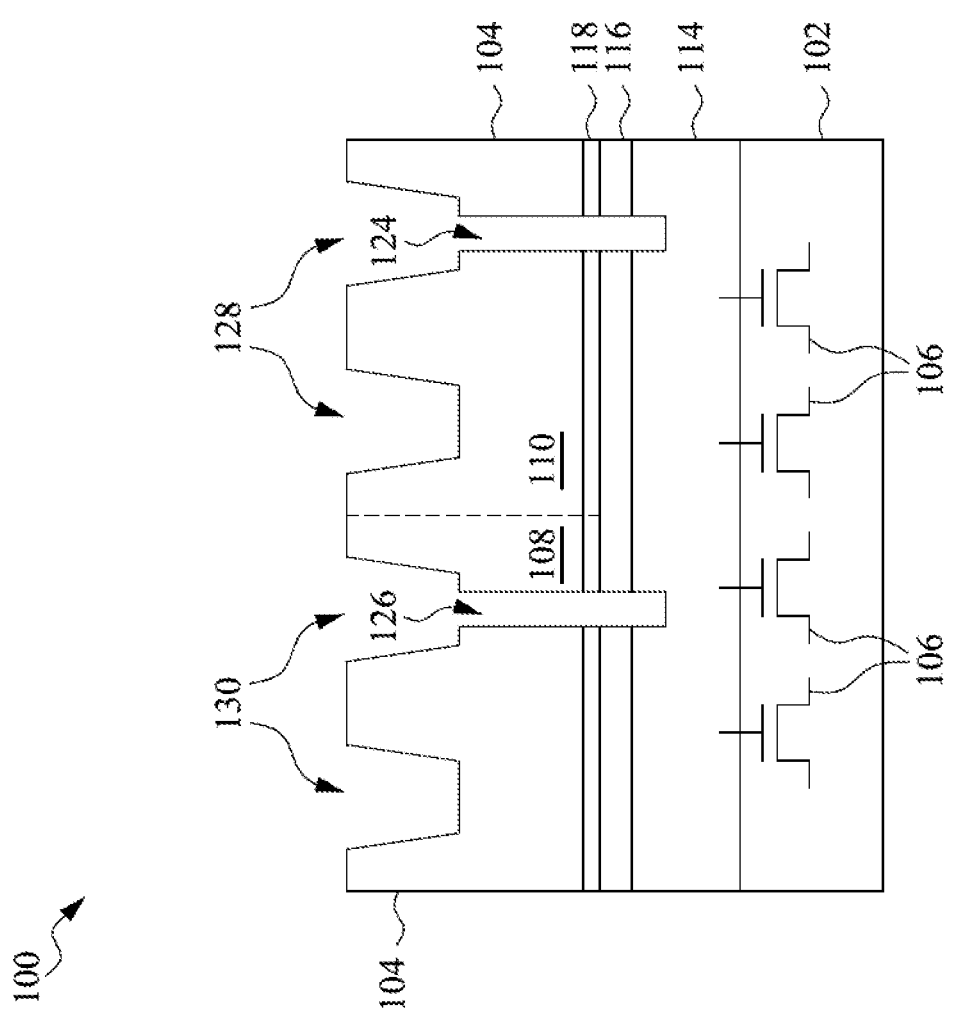

In FIG. 2E, trenches 128 have been opened in the second region 110. One of the trenches 128 contacts the trench 124. The trenches 128 do not extend through the entirety of the interlevel dielectric layer 104. Though not apparent in FIG. 2E, the trenches 128 extend into and out of the plane of the drawing sheet much further than does the trench 124. The trenches 128 are for electrodes of the capacitor 114, as will be set forth in more detail below.

In FIG. 2E, trenches 130 have been opened in the first region 108 one of the trenches 130 contacts the trench 126. The trenches 130 do not extend through the entirety of the interlevel dielectric layer 104. Though not apparent in FIG. 2E, the trenches 130 extend into and out of the plane of the drawing sheet much further than does the trench 124. The trenches 130 are for metal signal lines, as will be set forth in more detail below.

The trenches 128 and 130 can be formed using standard photolithography and etching techniques. A mask can be formed and patterned to expose the top surface of the interlevel dielectric layer 104 at the intended locations of the trenches 128 and 130. One or more etching processes can then be performed to etch the material of the interlevel dielectric layer 104. The etching processes can include wet etching or dry etching processes. In some embodiments, the etching processes are highly anisotropic. While two trenches 128 and two trenches 130 are shown in FIG. 2E, in practice a large number of trenches 128 and 130 may be formed in the first region 108 and the second region 110.

Figure 2F:
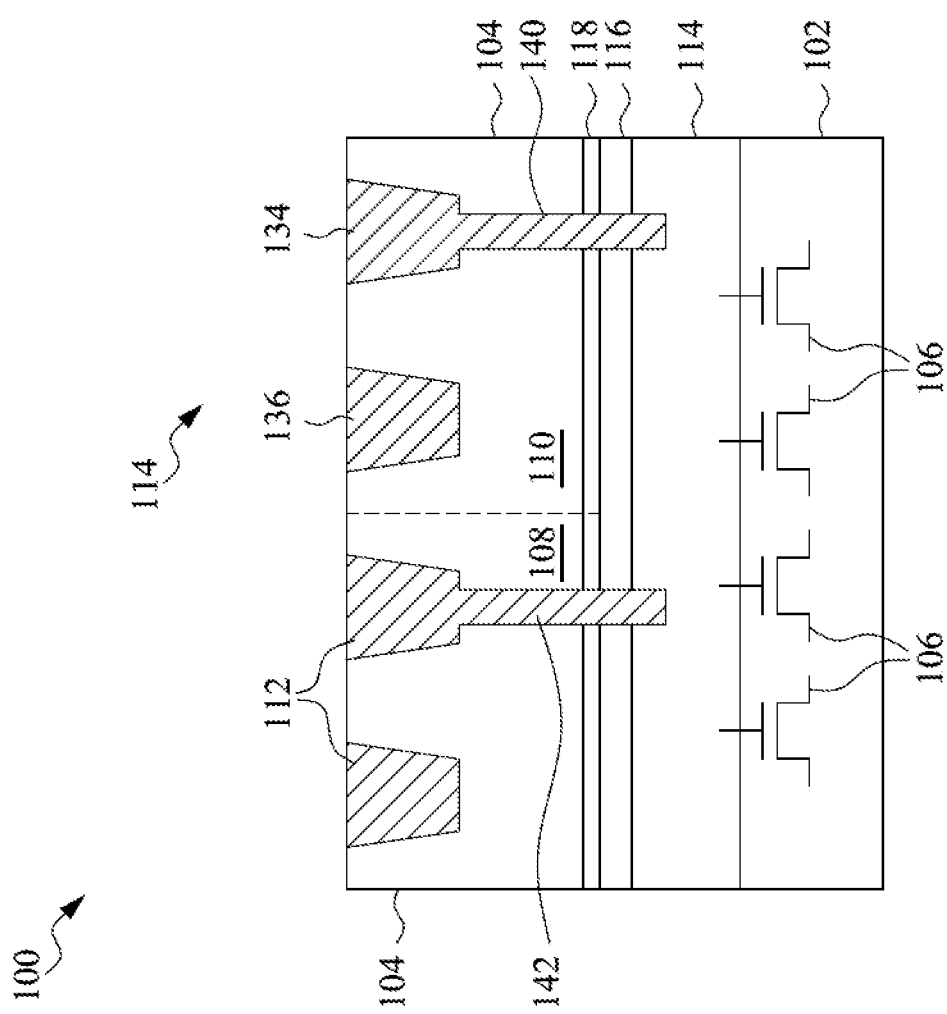

In FIG. 2F, a metal has been deposited. The metal fills the trenches 124, 126, 128, and 130. In particular, the deposition of the metal forms a conductive via 140 in the trench 124, a first electrode 134 of the capacitor 114 in the trench 128 connected to the trench 124, a second electrode 136 of the capacitor 114 in the other trench 128, a conductive via 142 in the trench 126, and signal lines 112 in the trenches 130.

After deposition of the metal, a chemical mechanical planarization (CMP) process has been performed to remove excess metal from the surface of the interlevel dielectric layer 104 and to make the top surfaces of the signal lines 112 and the electrodes 134 and 136 planer with the top surface of the interlevel dielectric layer 104.

In some embodiments, the metal includes copper. Alternatively, the metal can include one or more of tungsten, aluminum, titanium, gold, or other conductive materials. The metal can be deposited by PVD, CVD, ALD, or other suitable processes.

While FIG. 2F shows a single metal material in the various trenches, in practice multiple layers of metal may be deposited. For example, one or more thin barrier layers, liner layers, may be deposited on the sidewalls of the trenches 124, 126, 128, and 130. These layers may include one or more of titanium, tantalum, titanium nitride, tantalum nitride, or other materials. After the thin metal layers are formed, a metal fill material may be deposited to fill the remaining space of the trenches 124, 126, 128, and 130. The metal fill material may include copper or other materials described above. In some embodiments, a thin copper seed layer is first deposited by PVD. The remainder of the copper fill material is deposited by an electroless plating process. Other combinations of materials and processes can be utilized without departing from the scope of the present disclosure.

Figure 2G:
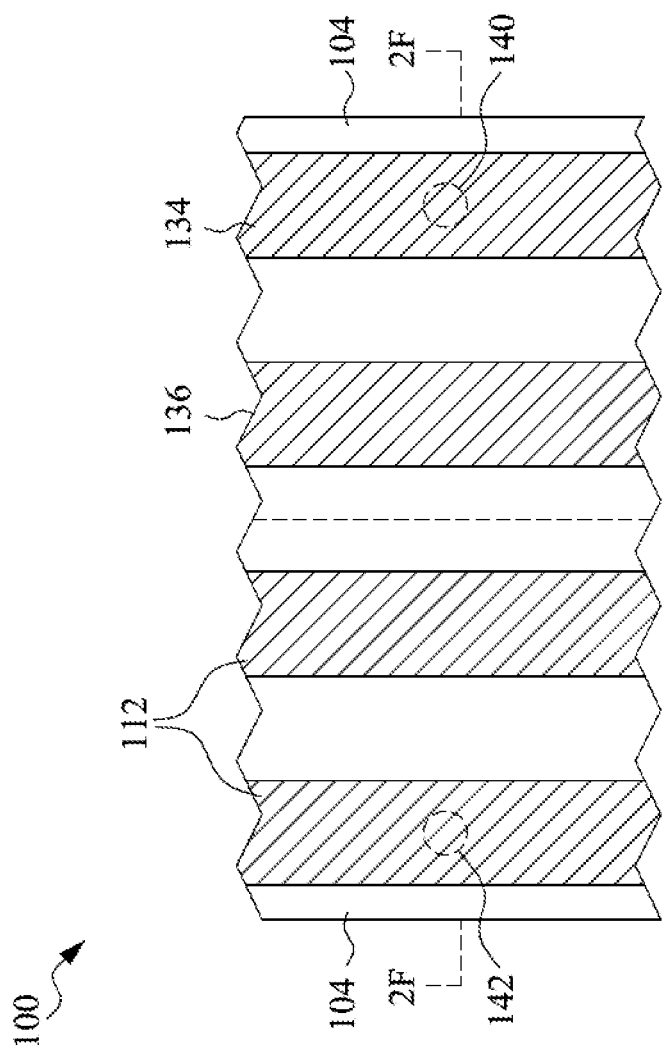
FIG. 2G is a top view of the integrated circuit of FIG. 2F, according to some embodiments.

FIG. 2G is a top view of the integrated circuit 100 at the stage of processing corresponding to FIG. 2F, according to some embodiments. FIG. 2G illustrates the signal lines 112, the first electrode 134, and the second electrode 136 extending in lines across the interlevel dielectric layer 104. In practice, the signal lines 112, the first electrode 134, and the second electrode 136 can have other shapes and patterns without departing from the scope of the present disclosure.

FIG. 2G also illustrates the shapes and positions of the conductive vias 140 and 142 in dashed lines below the right signal line 112 and the first electrode 134. FIG. 2G also illustrates the cross-section lines 2F indicating the position of the cross-sectional view of FIG. 2F.

Figure 2H:
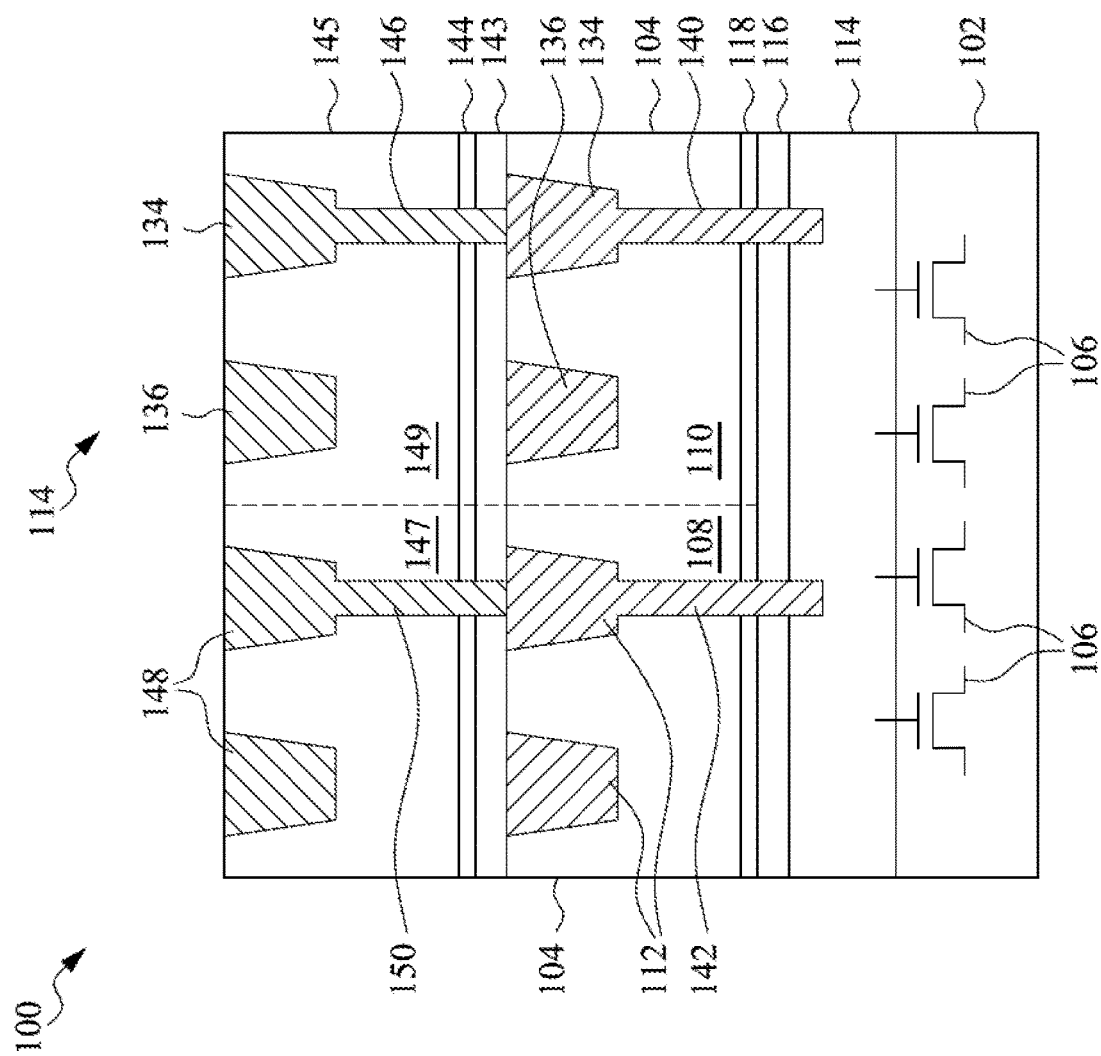

FIG. 2H is a cross-sectional view of the integrated circuit 100, according to some embodiments. In FIG. 2H, a second interlevel dielectric layer 145 has been formed over the first interlevel dielectric layer 104. The second interlevel dielectric layer has a first region 147 and a second region 149. The first region 147 has a lower dielectric constant of the second region 149. A conductive via 146 and a portion of the first electrode 134 and the second electrode 136 of the capacitor 114 have been formed in the second region 149 of the second interlevel dielectric layer 145. The conductive via 146 is in electrical contact with the portion of the first electrode 134 formed in the interlevel dielectric layer 104. A conductive via 150 and signal lines 148 have been formed in the first region 147 of the second interlevel dielectric layer 145. A dielectric layer 143 and the dielectric layer 144 are formed between the first interlevel dielectric layer 104 and the second interlevel dielectric layer 145.

In some embodiments, the dielectric layer 143, the dielectric layer 144, the second interlevel dielectric layer 145, the first region 147, the first region 149, the conductive vias 146 and 150, the second portions of the first electrode 134 and the second electrode 136, and the signal lines 148 can be formed with the same processes and materials as described in relation to the dielectric layers 116 and 118, the first interlevel dielectric layer 104, the conductive vias 140 and 142, the first portions of the first electrode 134 and second electrode 136, and the signal lines 112.

In practice, the integrated circuit 100 may include more interlevel dielectric layers than two. Each interlevel dielectric layer can include a region of low dielectric constant at a region of high dielectric constant as described previously. Each interlevel dielectric layer can include signal lines, capacitor electrodes, and conductive vias in accordance with principles of the present disclosure.

Figure 3:
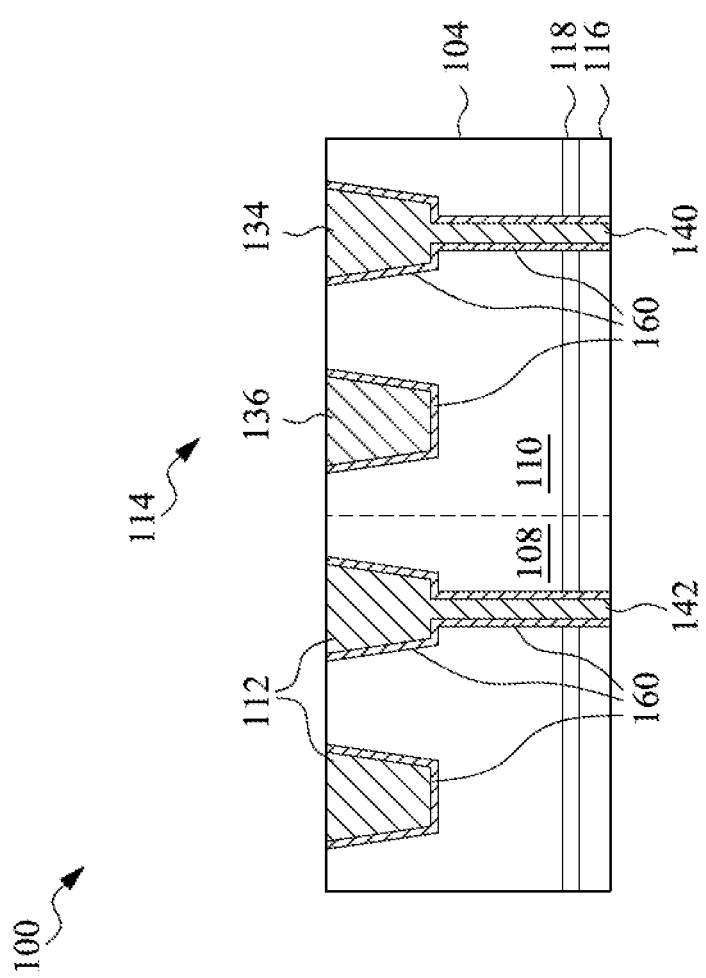
FIGS. 3-6 are cross-sectional views of integrated circuits, according to some embodiments.

FIG. 3 is a cross-sectional view of an integrated circuit 100, according to some embodiments. The integrated circuit 100 of FIG. 3 is substantially similar to the integrated circuit 100 of FIG. 2G, except that a thin barrier layer 160 has been deposited prior to deposition of the metal that forms the signal lines 112, the conductive vias 140 and 142, the first electrode 134, and the second electrode 136. The thin barrier layer 160 can have a thickness between 2 nm and 10 nm. The thin barrier layer 160 can be deposited by PVD, ALD, or CVD. The thin barrier layer 160 can include copper, manganese, tantalum, titanium, tantalum nitride, titanium nitride, or tungsten. The thin barrier layer 160 can have other materials, and thicknesses, deposition processes without departing from the scope of the present disclosure. After deposition of the thin barrier layer 160, the metal is deposited to fully form the signal lines 112, the conductive vias 140 and 142, the first electrode 134, and the second electrode 136. In FIG. 3, the dielectric layer 114 and the semiconductor substrate 102 are not shown for simplicity.

Figure 4:
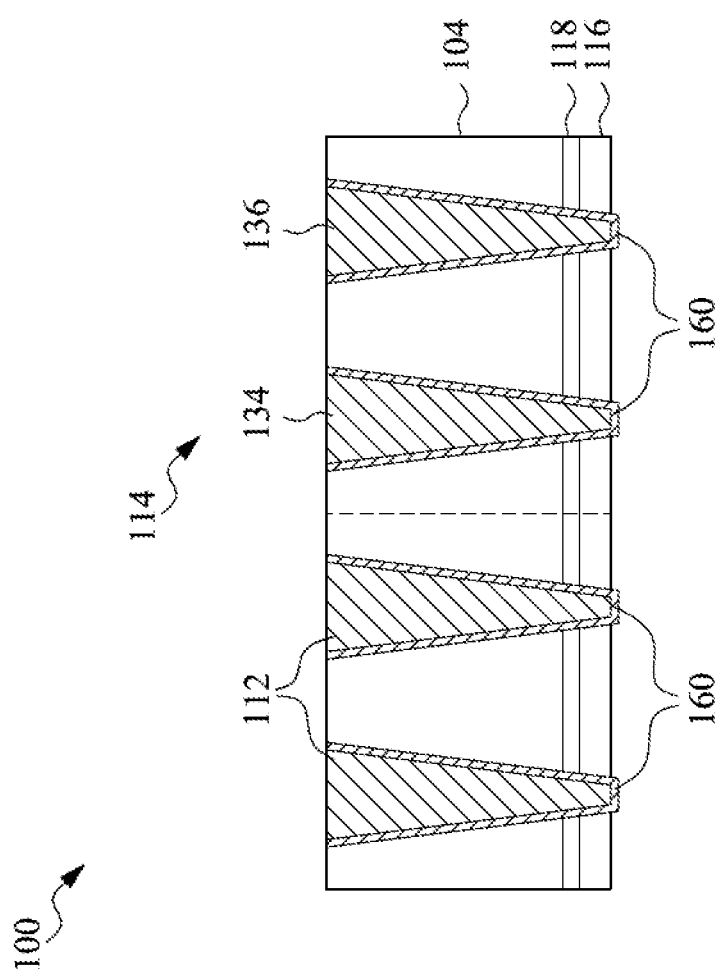

FIG. 4 is a cross-sectional view of an integrated circuit 100, according to some embodiments. The integrated circuit 100 of FIG. 4 is substantially similar to the integrated circuit 100 of FIG. 2G, except that the metal lines 112, the first electrode 134, and the second electrode 136 extend entirely through the interlevel dielectric layer 104, and through the dielectric layers 116 and 118. Accordingly, the separate conductive vias 140 and 142 are not present in the interlevel dielectric layer 104.

Figure 5:
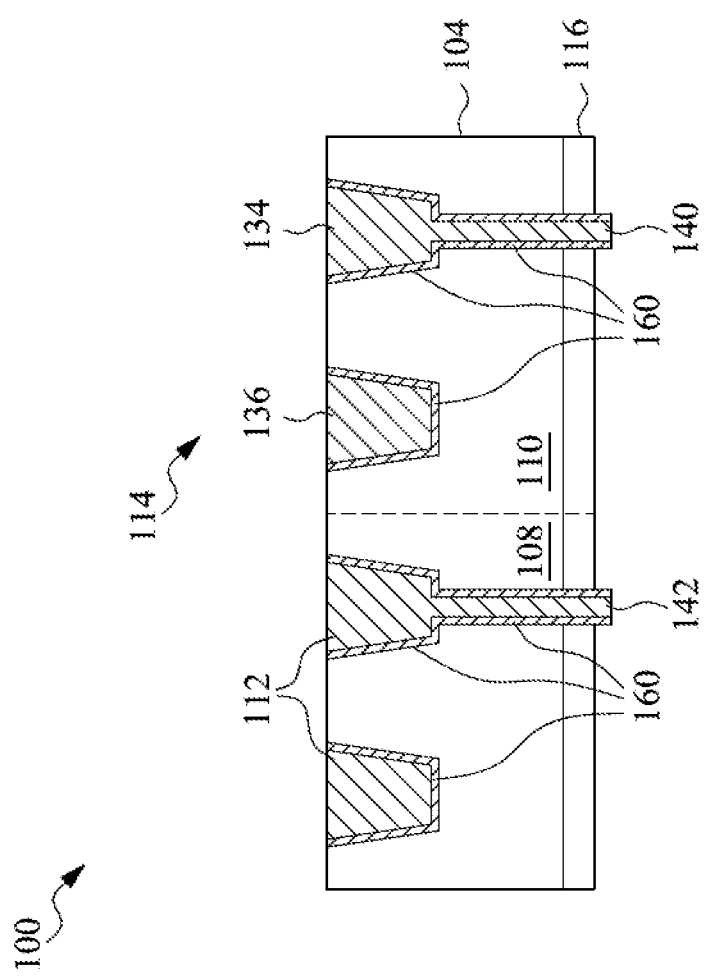

FIG. 5 is a cross-sectional view of an integrated circuit 100, according to some embodiments. The integrated circuit 100 of FIG. 5 is substantially similar to the integrated circuit 100 of FIG. 3, except that the dielectric layer 118 is not present. Accordingly, the interlevel dielectric layer 104 is formed directly on the dielectric layer 116.

Figure 6:
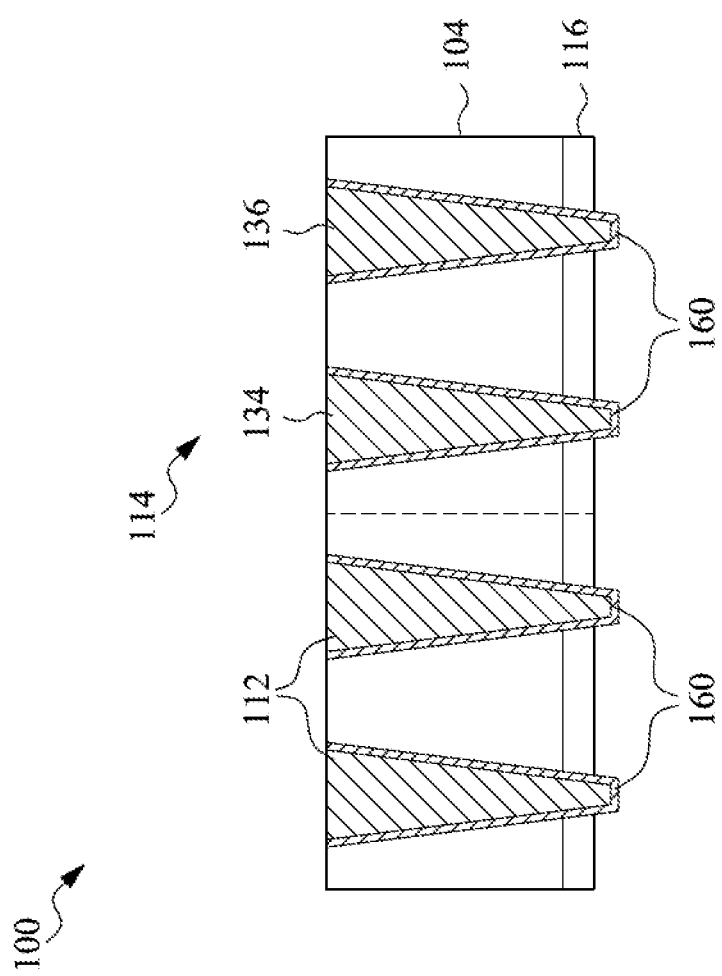

FIG. 6 is a cross-sectional view of an integrated circuit 100, according to some embodiments. The integrated circuit 100 of FIG. 6 is substantially similar to the integrated circuit 100 of FIG. 4, except that the dielectric layer 118 is not present. Accordingly, the interlevel dielectric layer 104 is formed directly on the dielectric layer 116.

Figure 7:
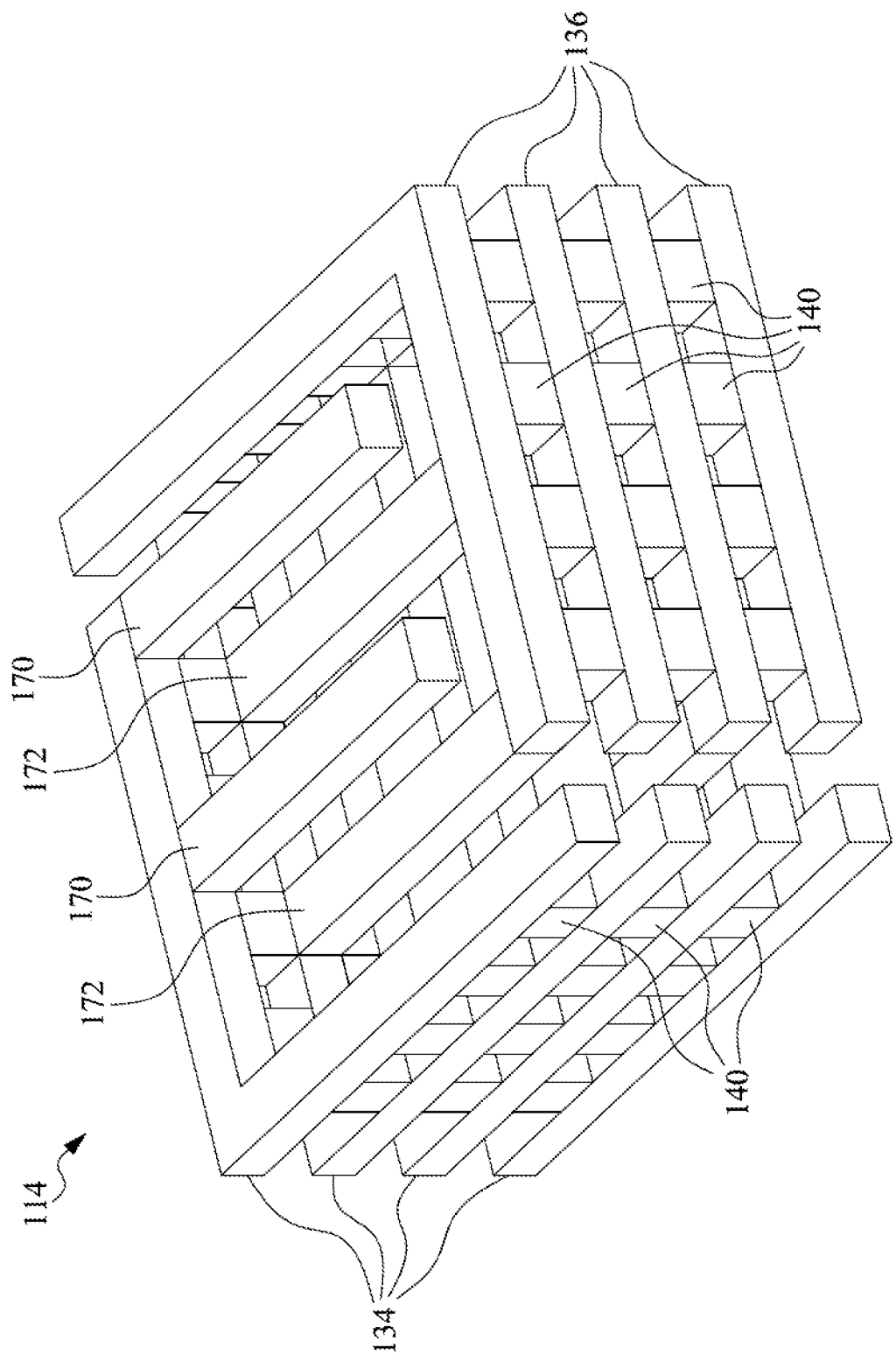
FIG. 7 is a perspective view of a capacitor, according to some embodiments.

FIG. 7 is a perspective view of the capacitor 114 of an integrated circuit 100, according to some embodiments. The capacitor 114 of FIG. 7 is one example of the capacitor 114 of FIG. 1. The capacitor 114 includes a first electrode 134 and a second electrode 136. The capacitor 114 includes four vertical levels. A respective portion of the first electrode 134 is formed in each level. The respective portions of the first electrode 134 in the various levels are connected by conductive vias 140. Though not shown in FIG. 7, each portion of the first electrode 134 is formed in a respective interlevel dielectric layer. Accordingly, in the example of FIG. 7 there are four interlevel dielectric layers.

A respective portion of the second electrode 136 is formed at each level. The respective portions of the second electrode 136 in the various levels are connected by conductive vias 140. Each portion of the second electrode 136 is formed a respective interlevel dielectric layer. The first electrode 134 includes, at each level, finger portions 170. The second electrode 136 includes, at each level, finger portions 172. The finger portions 170 and 172 are interleaved with each other and separated from each other by the material of the corresponding interlevel dielectric layer in which they are formed. A capacitor 114 can have other shapes and configurations without departing from the scope of the present disclosure.

Figure 8:
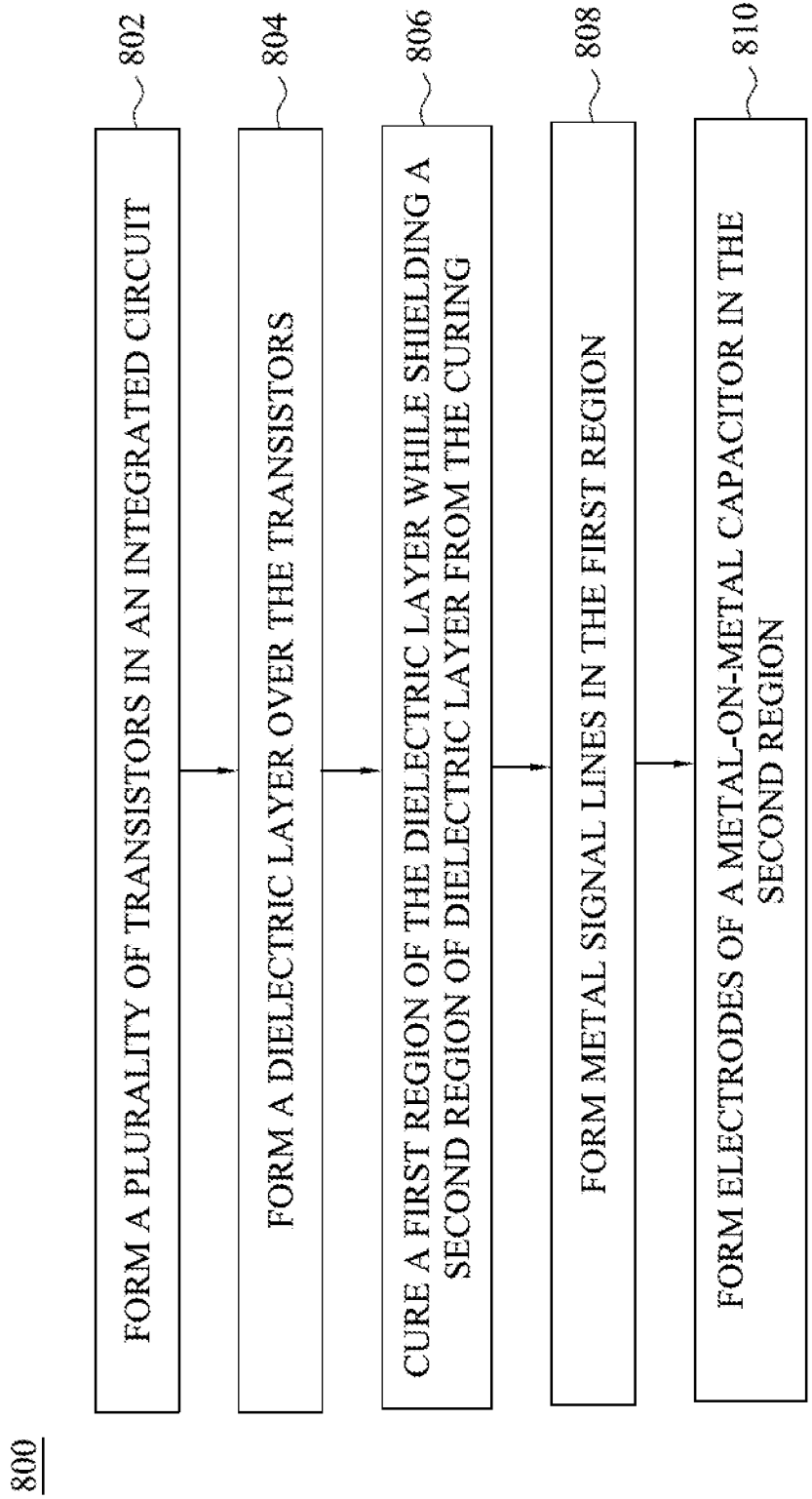
FIGS. 8 and 9 are flow diagrams of methods for forming an integrated circuit, according to some embodiments.

FIG. 8 is a flow diagram of a method 800 for forming an integrated circuit, according to some embodiments. At 802, the method 800 includes forming a plurality of transistors in an integrated circuit. One example of a plurality of transistors of the transistors 106 of FIG. 1. One example of an integrated circuit is the integrated circuit 100 of FIG. 1. At 804, the method 800 includes forming a dielectric layer over the transistors. One example of a dielectric layer is the dielectric layer 104 of FIG. 1. At 806, the method 800 includes curing a first region of the dielectric layer while shielding a second region of dielectric layer from the curing. One example of a first region is the first region 108 of FIG. 1. One example of a second region is the second region 110 of FIG. 1. At 808, the method 800 includes forming metal signal lines in the first region. One example of metal signal lines are the metal signal lines 112 of FIG. 1. At 810, the method 800 includes forming electrodes of a metal-on-metal capacitor in the second region.

Figure 9:
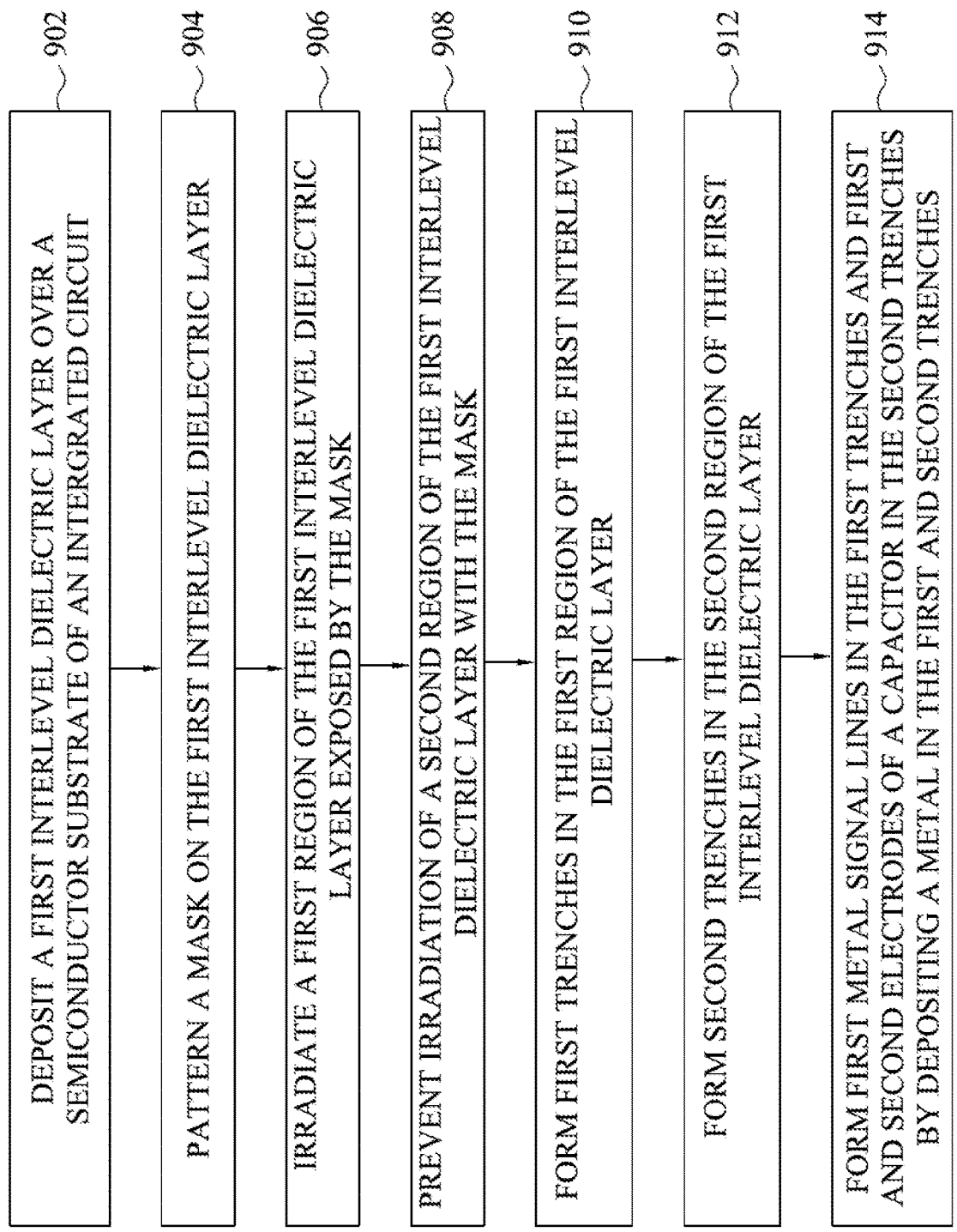

FIG. 9 is a flow diagram of a method 900 for forming an integrated circuit, according to some embodiments. At 902, the method 900 includes depositing a first interlevel dielectric layer over a semiconductor substrate of an integrated circuit. One example of a first interlevel dielectric layer is the first interlevel dielectric layer 104 of FIG. 2G. One example of a semiconductor substrate is the semiconductor substrate 102 of FIG. 2G. At 904, the method 900 includes patterning a mask on the first interlevel dielectric layer. One example of a mask is the mask 902 of FIG. 2B. At 906, the method 900 includes irradiating a first region of the first interlevel dielectric layer exposed by the first mask. One example of a first region is the first region 108 of FIG. 2G. One example of the second region is the second region 110 of FIG. 2G. At 908, the method 900 includes preventing irradiation of a second region of the first interlevel dielectric layer with the first mask. At 910, the method 900 includes forming first trenches in the first region of the first interlevel dielectric layer. One example of first trenches of the trenches 130 of FIG. 2E. At 912, the method 900 includes forming second trenches in the second region of the first interlevel dielectric layer. One example of second trenches are the trenches 128 of FIG. 2E. At 914, the method 900 includes forming first metal signal lines in the first trenches and first and second electrodes of a capacitor in the second trenches by depositing a metal in the first and second trenches. One example of first metal signal lines are the metal signal lines 112 of FIG. 2G. One example of first and second electrodes are the first and second electrodes 134 and 136 of FIG. 2G.

In some embodiments, a method includes forming a plurality of transistors in an integrated circuit, forming a dielectric layer over the transistors, and curing a first region of the dielectric layer while shielding a second region of dielectric layer from the curing. The method includes forming metal signal lines in the first region and forming electrodes of a metal-on-metal capacitor in the second region.

In some embodiments, an integrated circuit includes a plurality of transistors and a first interlevel dielectric layer above the transistors. The first interlevel dielectric layer includes a first region having a first dielectric constant and a second region having a second dielectric constant greater than the first dielectric constant. The integrated circuit includes first metal signal lines in the first region of the first interlevel dielectric layer and a capacitor. The capacitor includes a first electrode at least partially in the second region of the first interlevel dielectric layer and a second electrode at least partially in the second region of the first interlevel dielectric layer.

In some embodiments, a method includes depositing a first interlevel dielectric layer over a semiconductor substrate of an integrated circuit, patterning a first mask on the first interlevel dielectric layer, and irradiating a first region of the first interlevel dielectric layer exposed by the first mask. The method includes preventing irradiation of a second region of the first interlevel dielectric layer with the first mask, forming first trenches in the first region of the first interlevel dielectric layer, and forming second trenches in the second region of the first interlevel dielectric layer. The method includes forming first metal signal lines in the first trenches and first and second electrodes of a capacitor in the second trenches by depositing a metal in the first and second trenches.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a plurality of transistors;
   a dielectric layer over the transistors and including;
   a first region cured with a curing process;
   a second region not cured with the curing process and having a top surface substantially coplanar with a top surface of the first region;
   metal signal lines in the first region; and
   a metal-on-metal capacitor including electrodes in the second region and of a same material as the metal signal lines, wherein the first region has a lower dielectric constant than the second region.

2. The integrated circuit of claim 1, further wherein the metal signal lines and the capacitor electrodes are formed in a same deposition step.

3. The integrated circuit of claim 1, wherein the dielectric layer includes SiOCH.

4. The integrated circuit of claim 1, further comprising:
   first trenches in the first region of the dielectric layer; and
   second trenches in the second region of the dielectric layer, wherein the metal signal lines are in the first trenches and the capacitor electrodes are in the second trenches.

5. The integrated circuit of claim 4, further comprising:
   a third trench in the second region; and
   a conductive via in the third trench in contact with and below one of the capacitor electrodes.

6. The integrated circuit of claim 5, further comprising a silicon carbide layer over the transistors, wherein the dielectric layer is on the silicon carbide layer.

7. The integrated circuit of claim 6, wherein the third trench extends through the silicon carbide layer.

8. The integrated circuit of claim 7, further comprising a tetraethoxysilane layer on the silicon carbide layer, wherein the dielectric layer is on the tetraethoxysilane layer, wherein the third trench extends through the tetraethoxysilane layer and the silicon carbide layer.

9. The integrated circuit of claim 4, wherein the first and second trenches extend below the dielectric layer, wherein the metal signal lines and the capacitor electrodes extend below the first dielectric layer.

10. The integrated circuit of claim 1, wherein the signal lines include copper.

11. An integrated circuit, comprising:
a plurality of transistors;
a first interlevel dielectric layer above the transistors and including:
a first region having a first dielectric constant; and
a second region having a second dielectric constant greater than the first dielectric constant;
first metal signal lines in the first region of the first interlevel dielectric layer; and
a capacitor including:
a first electrode at least partially in the second region of the first interlevel dielectric layer; and
a second electrode at least partially in the second region of the first interlevel dielectric layer.

12. The integrated circuit of claim 1, wherein the first region of the first interlevel dielectric layer is more porous than the second region of the first interlevel dielectric layer.

13. The integrated circuit of claim 11, further comprising:
a second interlevel dielectric layer above the first interlevel dielectric layer and including:
a first region having the first dielectric constant; and
a second region having the second dielectric constant higher than the first dielectric constant; and
second metal lines in the first region of the second interlevel dielectric layer, wherein the first electrode is at least partially in the second region of the second interlevel dielectric layer, wherein the second electrode is at least partially in the second region of the second interlevel dielectric layer.

14. The integrated circuit of claim 13 wherein the capacitor includes a conductive via extending between the second region of the first dielectric layer and the second region of the second interlevel dielectric layer.

15. The integrated circuit of claim 11, wherein the first signal lines and the first and second electrodes include a same metal.

16. The integrated circuit of claim 15, wherein the metal is copper.

17. An integrated circuit, comprising:
a substrate;
a plurality of transistors;
a first interlevel dielectric layer above the transistors and including a first region having a first dielectric constant
a second region having a second dielectric constant greater than the first dielectric constant;
first metal signal lines in the first region of the first interlevel dielectric layer; and
a capacitor including a first electrode at least partially in the second region of the first interlevel dielectric layer and a second electrode at least partially in the second region of the first interlevel dielectric layer;
a second interlevel dielectric layer above the first interlevel dielectric layer and including a first region having the first dielectric constant and a second region having the second dielectric constant higher than the first dielectric constant; and
second metal lines in the first region of the second interlevel dielectric layer, wherein the first electrode is at least partially in the second region of the second interlevel dielectric layer, wherein the second electrode is at least partially in the second region of the second interlevel dielectric layer.

18. The integrated circuit of claim 17, wherein the first signal lines and the first and second electrodes include a same metal.

19. The integrated circuit of claim 17, wherein the first and second electrodes include interleaving finger portions.

20. The integrated circuit of claim 17, wherein the first metal signal lines include copper.

* * * * *